United States Patent
Dvorak et al.

(10) Patent No.: US 11,516,929 B2
(45) Date of Patent: Nov. 29, 2022

(54) POWER ADAPTER HOUSING WITH SNAPS CAPABLE OF BIDIRECTIONAL DEFLECTION

(71) Applicant: Apple Inc., Cupertino, CA (US)

(72) Inventors: Peter A. Dvorak, Menlo Park, CA (US); Jeremy M. Dahl, Menlo Park, CA (US); Michael A. Foote, Santa Clara, CA (US); Brian K. Thorne, Santa Clara, CA (US); Cesar Lozano Villarreal, Campbell, CA (US)

(73) Assignee: APPLE INC., Cupertino, CA (US)

( * ) Notice: Subject to any disclaimer, the term of this patent is extended or adjusted under 35 U.S.C. 154(b) by 172 days.

(21) Appl. No.: 16/996,795

(22) Filed: Aug. 18, 2020

(65) Prior Publication Data

US 2022/0061171 A1 Feb. 24, 2022

(51) Int. Cl.
| | | |
|---|---|---|
| H05K 5/00 | (2006.01) | |
| H01R 13/66 | (2006.01) | |
| H01R 31/06 | (2006.01) | |
| H01R 13/44 | (2006.01) | |
| H05K 5/02 | (2006.01) | |

(52) U.S. Cl.
CPC ....... *H05K 5/0052* (2013.01); *H01R 13/6675* (2013.01); *H01R 31/065* (2013.01); *H01R 13/44* (2013.01); *H05K 5/0247* (2013.01)

(58) Field of Classification Search
CPC .................................................. H05K 5/0052
See application file for complete search history.

(56) References Cited

U.S. PATENT DOCUMENTS

| | | | |
|---|---|---|---|
| 6,097,607 A | 8/2000 | Carroll et al. | |
| 6,567,277 B1 | 5/2003 | Doherty et al. | |
| 7,794,251 B2* | 9/2010 | Wen | H01R 27/00 439/171 |
| 8,388,352 B1* | 3/2013 | Chong | H01R 35/04 439/11 |
| 8,414,323 B2 | 4/2013 | Yu et al. | |
| 10,674,840 B2 | 6/2020 | Haroush | |
| 2012/0037415 A1* | 2/2012 | Demma | H05K 5/0052 174/480 |
| 2014/0240931 A1* | 8/2014 | Rosenthal | E05F 15/695 361/728 |

(Continued)

*Primary Examiner* — Hung V Ngo
(74) *Attorney, Agent, or Firm* — BakerHostetler

(57) ABSTRACT

A power adapter is disclosed. The power adapter includes housing parts that carries electronic components. To secure the housing parts together, one housing part includes snaps and another housing part includes protrusions and rails. During assembly, the protrusions slide under the snap, causing the snap to deflect in one direction, while the rails slide over the snap, which keeps the snap partially flat but also causes the snap to deflect in another direction. The engagement (during assembly) of the rails and the protrusions to opposing surfaces of the snap cause bi-directional deflection/bending of the snap. When each protrusion is positioned into an opening of the snap, the snap returns to a flat, non-deflected state, and the housing parts are secured together by the snap, protrusions, and rails. The rails support the snaps by limiting or preventing additional deflection of the snap, which subsequently promotes the housing remaining together.

20 Claims, 15 Drawing Sheets

(56) References Cited

U.S. PATENT DOCUMENTS

| | | | |
|---|---|---|---|
| 2014/0370742 A1* | 12/2014 | Andre | G06F 1/1632 403/120 |
| 2016/0044800 A1* | 2/2016 | Jarvis | H05K 7/06 361/759 |
| 2017/0150619 A1* | 5/2017 | Kojima | H05K 5/0052 |
| 2021/0408743 A1* | 12/2021 | Lashinsky | H05K 7/1417 |

* cited by examiner

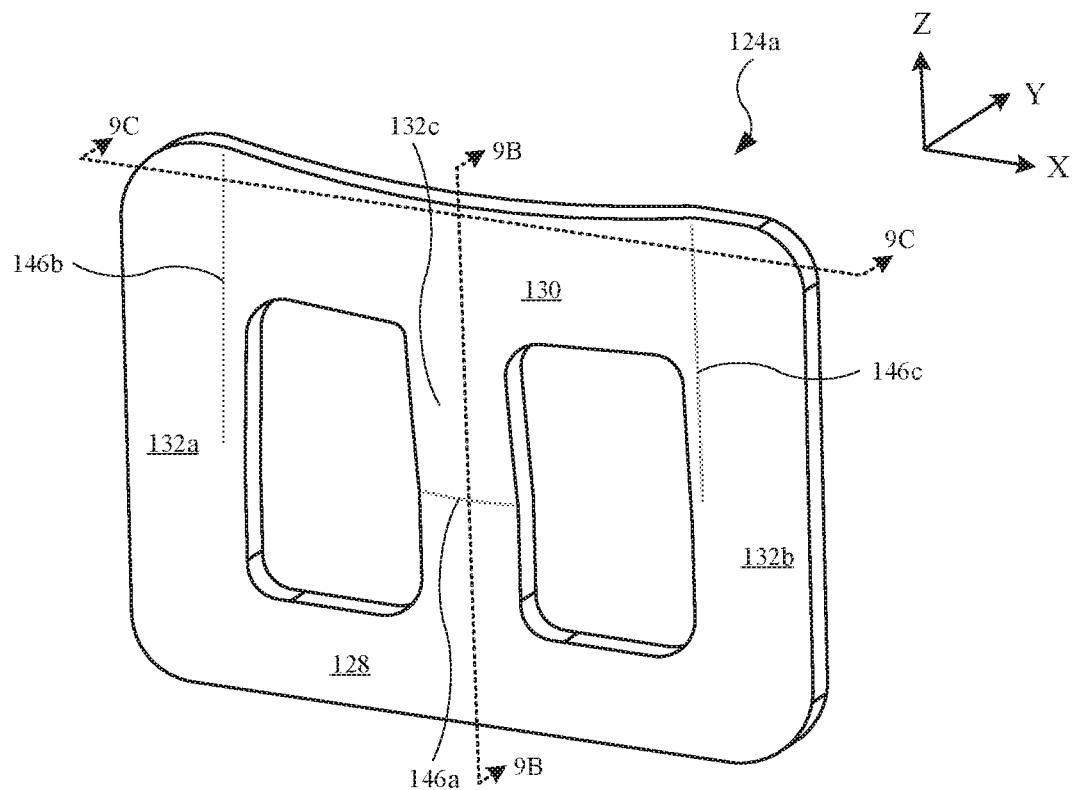
FIG. 9A
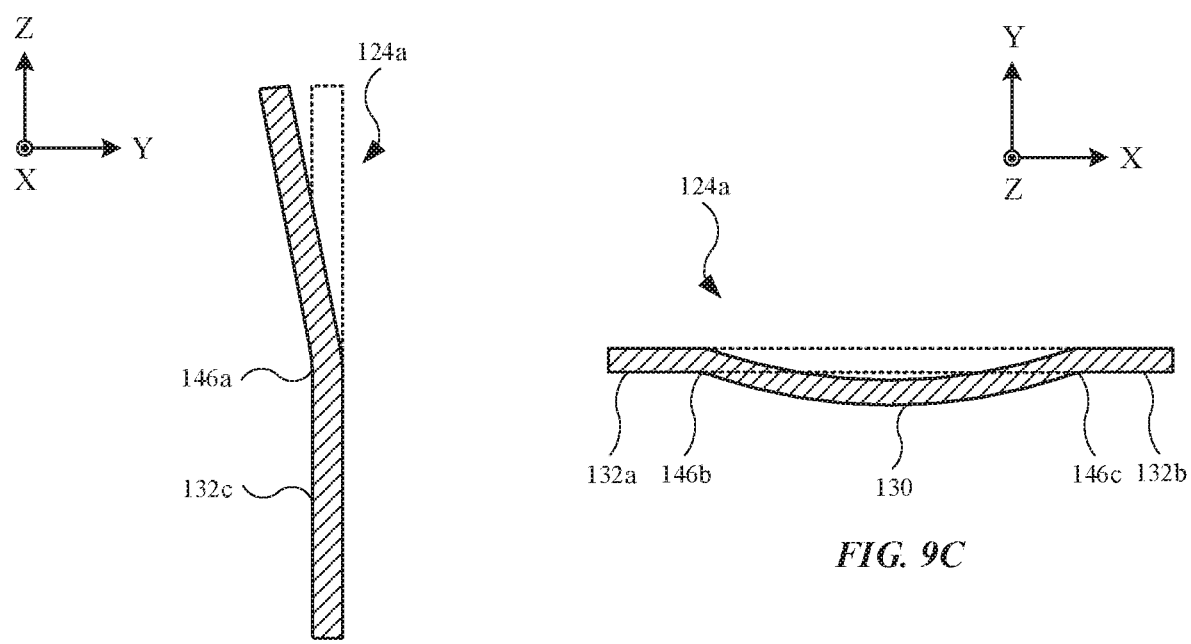
FIG. 9B
FIG. 9C

ABLE OF BIDIRECTIONAL
POWER ADAPTER HOUSING WITH SNAPS CAPABLE OF BIDIRECTIONAL DEFLECTION

FIELD

The following description relates to power adapters. In particular, the following description relates to power adapters with housing parts that integrate modified snaps designed to secure with protrusions/detents. At least one of the housing parts may include rails that fit over the snaps. The snaps are designed for significant flexibility, as they are designed to deflect/bend in multiple, different directions. In this regard, during an assembly of two housing parts of a power adapter, the protrusions cause the snaps to deflect in one direction, while the rails engage the ends of the snaps, causing the snaps to bend in another, different direction. Subsequent to assembly, the rails and protrusion further limit or prevent movement of the snaps, thereby maintaining the housing parts together.

BACKGROUND

Power adapters can include multiple housing parts used to store components for a power adapter. At least one method for combining the housing parts is to weld, including ultrasonic weld, the housing parts together. However, ultrasonic welding may provide some drawbacks. For instance, ultrasonic welding uses a horn that provides a high-frequency oscillation to the housing parts to weld them together. The housing parts can be exposed to thermal energy generated during an ultrasonic welding operation, which can warp the housing parts and reduce their aesthetic appearance. Regarding the appearance of the housing parts, the ultrasonic welding operation may result in marks, including scuff marks or other residual marking, on at least one of the housing parts. This may be significantly noticeable when the housing parts are white, for example. In order to overcome this issue, a sacrificial film (e.g., soft polyethylene) can cover the housing parts during the ultrasonic welding operation to minimize damage. However, these films and thin covers are not reusable, and generally wasteful. Moreover, power adapters can include several internal electronic components on a circuit board, any of which may be sensitive to high frequency and/or thermal energy. Accordingly, the ultrasonic welding operation may cause damage the circuit board and/or the electronic components, and the associated issues to the internal components of the power adapter may be unknown until the power adapter is tested or is in use. Additionally, welds created through the ultrasonic welding operation may often be weaker than the material of the housing parts. Also, the welds may include geometric stress concentrations, leading to a stress gradient(s) along the weld region.

SUMMARY

In one aspect, a power adapter for providing electrical energy to electronic devices is described. The power adapter may include a first housing part. The first housing part may include a protrusion and a rail. The power adapter may further include a second housing part that includes a snap. The snap may include an opening and a column. In some embodiments, an assembled state defined by the first housing part secured with the second housing part comprises the protrusion positioned in the opening and the rail covering the column.

In another aspect, a power adapter for providing electrical energy to electronic devices is described. The power adapter may include a first housing part. The first housing part may include a first rail and a second rail. The first housing part may further include a first protrusion that defines a first inclined surface, as well as a second protrusion that defines a second inclined surface. The power adapter may further include a second housing part includes a snap. The snap may include a first opening configured to receive the first protrusion, as well as a second opening configured to receive the second protrusion. The snap may further include a first column and a second column. In some embodiments, during an assembly of the first housing part with the second housing part, the first protrusion and the second protrusion deflect the snap in accordance with the first inclined surface and the second inclined surface, and the first rail and the second rail secure the first column and the second column, respectively, such that the snap lacks deflection at the first column and the second column.

In another aspect, an electronic device for providing electrical energy to electronic devices is described. The electronic device may include a first housing part. The first housing part may include a first rail and a second rail. The first housing part may further include a first protrusion and a second protrusion. In some embodiments, the first protrusion and the second protrusion are positioned between the first rail and the second rail. The electronic device may further include a second housing part includes a snap. In some embodiments, during an assembly of the first housing part with the second housing part, the snap is configured to bend in a first direction and a second direction different from the first direction based upon engagement with the first rail, the second rail, the first protrusion, and the second protrusion.

Other systems, methods, features and advantages of the embodiments will be, or will become, apparent to one of ordinary skill in the art upon examination of the following figures and detailed description. It is intended that all such additional systems, methods, features and advantages be included within this description and this summary, be within the scope of the embodiments, and be protected by the following claims.

BRIEF DESCRIPTION OF THE DRAWINGS

The disclosure will be readily understood by the following detailed description in conjunction with the accompanying drawings, wherein like reference numerals designate like structural elements, and in which:

FIG. 9A-9C illustrate the snap shown in FIG. 8, showing the snap in a deflected state, in accordance with some described embodiments;

Figure 1:
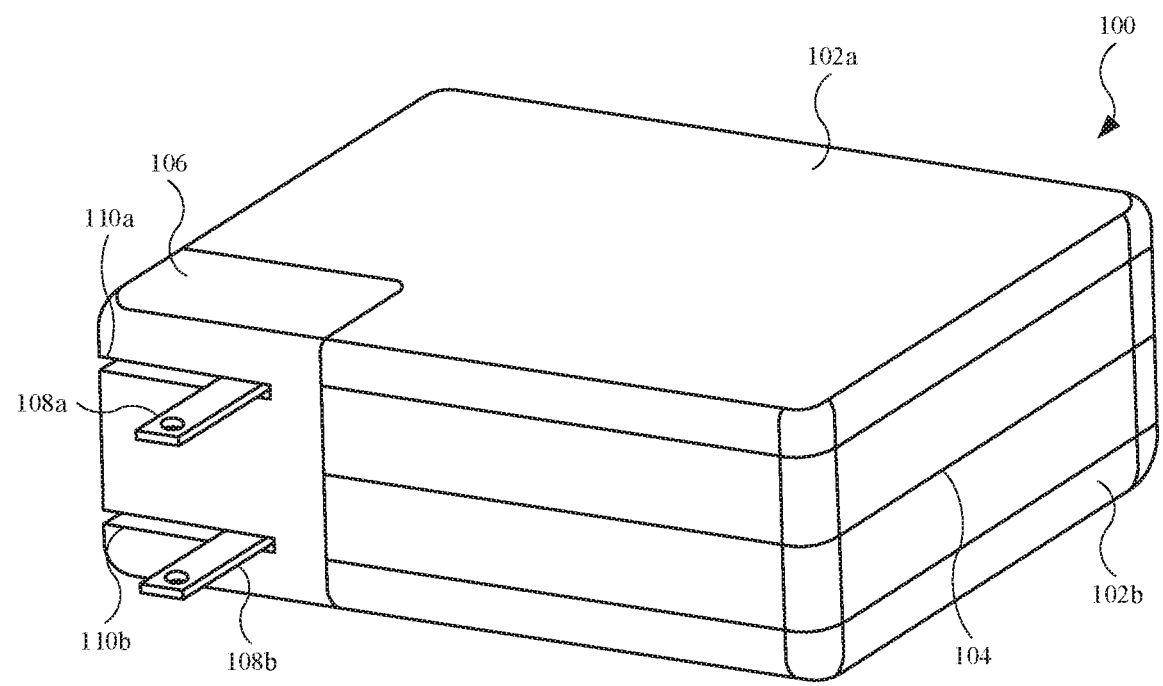
FIG. 1 illustrates an isometric view of an embodiment of a power adapter.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting such that other embodiments may be used, and changes may be made without departing from the spirit and scope of the described embodiments.

The following disclosure relates to modifications and enhancements to housings for devices, such as power adapters. Specifically, this disclosure relates to connection/latching features that hold two housing parts together. For instance, for a power adapter with two housing parts, one housing part includes multiple protrusions, or detents, as well as multiple rails. The remaining housing part may include a snap, defined by a structure extending from the housing part with an opening for each protrusion. Prior to and subsequent to an assembly operation between two housing parts, the snap may define a planar, or flat, structure. However, during the assembly operation, the snap is designed to deflect/bend. In particular, the snap can deflect in multiple, different directions based upon the engagement with the protrusions and rails. As a result, the snap facilitates assembly of the power adapter.

In order to secure the housing parts together, the protrusions are brought into contact with the snap. The contact force provided by the protrusions causes the snap to deflect, or bend, out of its planar configuration. In this regard, the snap deflects in at least one direction consistent with a cantilevered configuration. Additionally, while the protrusions engage the snap, the rails slide over the ends of the snap, causing the snap to bend in another, different direction. In this regard, the snap can deflect along two different axes, e.g., X- and Y-axes (in Cartesian coordinates), in order to accommodate the assembly operation between the two housing parts of the power adapter. Moreover, while the snap is deflected in different directions, the ends of the snap, i.e., regions over which the snap is covered by the rails, remain generally planar/flat.

Additionally, the protrusions may include modifications to facilitate the assembly process. For example, each of the protrusions can be modified to include a tapered surface (or surfaces). The tapered surfaces provide an incline to allow the snap to more easily pass over the protrusions.

When each protrusion is located in a respective opening of the snap, the housing parts are coupled together and the snap returns to its original planar configuration, i.e., the snap is no longer deflected. Based on the rails covering the ends of the snap, a force is provided to the snap (by the rails) that may prevent the snap from sliding away from the protrusions. As a result, the housing parts remain together despite external forces acting on the housing parts. Accordingly, the design configuration of the snaps, protrusions, and rails may provide a power adapter with housing parts that require a disassembly force (or force required to disassemble the housing parts) that is significantly greater than that of the assembly force (or force required to assemble the housing parts). Thus, the power adapter is less likely to become disassembled.

The aforementioned modifications and enhancements to the housing parts provide advantages over other assembly techniques. For example, the snaps, protrusion, and rails can preclude the need for external tools, such as ultrasonic welding tools. In this manner, the snaps, protrusion, and rails obviate the need for high-frequency or high-heat application, such as ultrasonic welding, to the power adapter during assembly. Accordingly, the likelihood of damage to the housing parts or electronic components held by the housing parts is reduced.

Further, snaps shown and described herein offer unique advantages over traditional snaps. For instance, the bi-directional deflecting/bending of the snaps described herein facilitate the assembly process but resist additional deflection and provide an enhanced (i.e., relatively higher) retention force once assembled (due in part to the rails), and thus are less likely to allow the housing parts to disassemble, which is critical particularly when the device is in electrical contact with a 120-Volt source or some other high voltage source. The modifications, if any, to traditional snaps do not provide sufficient force against unwanted disassembly, particularly when the housing parts are critical for safety, such as housing parts of a power adapter.

These and other embodiments are discussed below with reference to FIGS. 1-16. However, those skilled in the art will readily appreciate that the detailed description given herein with respect to these Figures is for explanatory purposes only and should not be construed as limiting.

FIG. 1 illustrates an isometric view of an embodiment of a power adapter 100. Power adapter 100 may refer to electronic device defined by an alternating current ("AC") adapter or charger designed to plug into a wall outlet (not shown in FIG. 1), which may include a 110-Volt to 120-Volt ("V") AC source. In this regard, power adapter 100 is designed to receive AC and convert to direct current ("DC"), and supply DC at a specified level (e.g., 12-Volt DC) to various electronic devices (not shown in FIG. 1), such as mobile wireless communication devices (e.g., smartphones, tablet computing devices), desktop computing devices, and laptop computing devices. Power adapter 100 can be designed to provide a specified amount of power. In this regard, power adapter 100 may also be referred to as a 5-Watt ("W"), a 12-W, 18-W, or a 20-W adapter, as non-limiting examples, depending upon the electronic components (not shown in FIG. 1) of power adapter 100. In some embodiments, power adapter 100 is rated for 100-240 V AC.

Power adapter 100 may include a housing part 102a and a housing part 102b. Housing parts 102a and 102b may be referred to as a first housing part and a second housing part, respectively. Housing parts 102a and 102b may include a non-metal material(s), such as a plastic (as a non-limiting example). During assembly, housing parts 102a and 102b are joined along a seam 104.

Power adapter 100 may include a plug 106 that includes a prong 108a and a prong 108b, each of which is designed to electrically couple with the aforementioned wall outlet. In some embodiments, plug 106 is integrally formed with, and non-separable from, housing parts 102a and 102b. In the embodiment shown in FIG. 1, plug 106 is separable from housing parts 102a and 102b. Also, prongs 108a and 108b are rotatable, and may be positioned in an opening 110a and an opening 110b, respectively.

Figure 2:
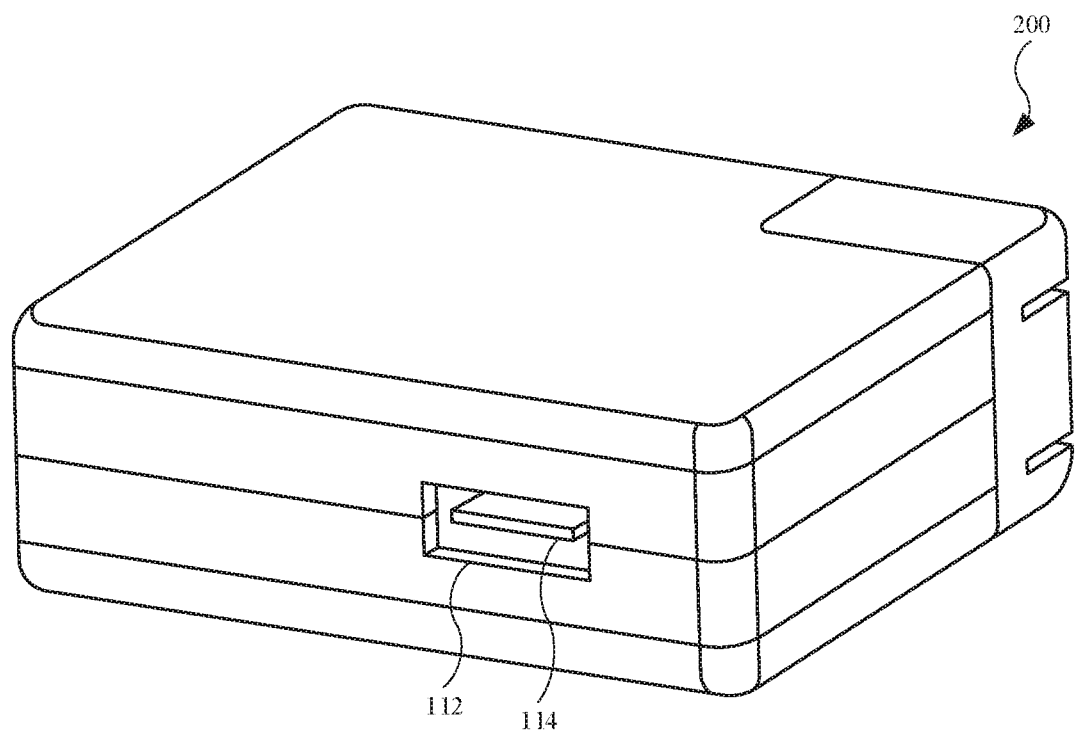
FIG. 2 illustrates an alternate isometric view of the power adapter shown in FIG. 1, showing additional features.

FIG. 2 illustrates an alternate isometric view of power adapter 100 shown in FIG. 1, showing additional features. As shown, power adapter 100 includes an opening 112 and a circuit board 114 aligned with opening 112. Circuit board 114 can be designed in accordance with an industry standard, such as Universal Serial Bus ("USB"), including USB-C (as a non-limiting example). Circuit board 114 is designed to electrically couple with a cord-cable assembly (not shown in FIG. 2), allowing power adapter 100 to supply power to one of the aforementioned electronic devices. Alternatively, in some embodiments (not shown), power adapter 100 includes a cord that replaces circuit board 114.

FIGS. 1 and 2 show and describe power adapter 100 in accordance with an industry standard. For instance, prongs 108a and 108b (shown in FIG. 1) represent two pins that are generally flat and parallel with respect to each other. However, power adapter 100 can be modified for use in accordance with another industry standard. For instance, in some exemplary embodiments, prongs 108a and 108b are non-parallel prongs. Further, in some exemplary embodiments, power adapter 100 includes three prongs, at least one of which is cylindrical or tubular. Also, in some exemplary embodiments, power adapter 100 is designed for use (in terms of circuitry and power rating) with a 220- to 240-Volt AC source.

Figure 3:
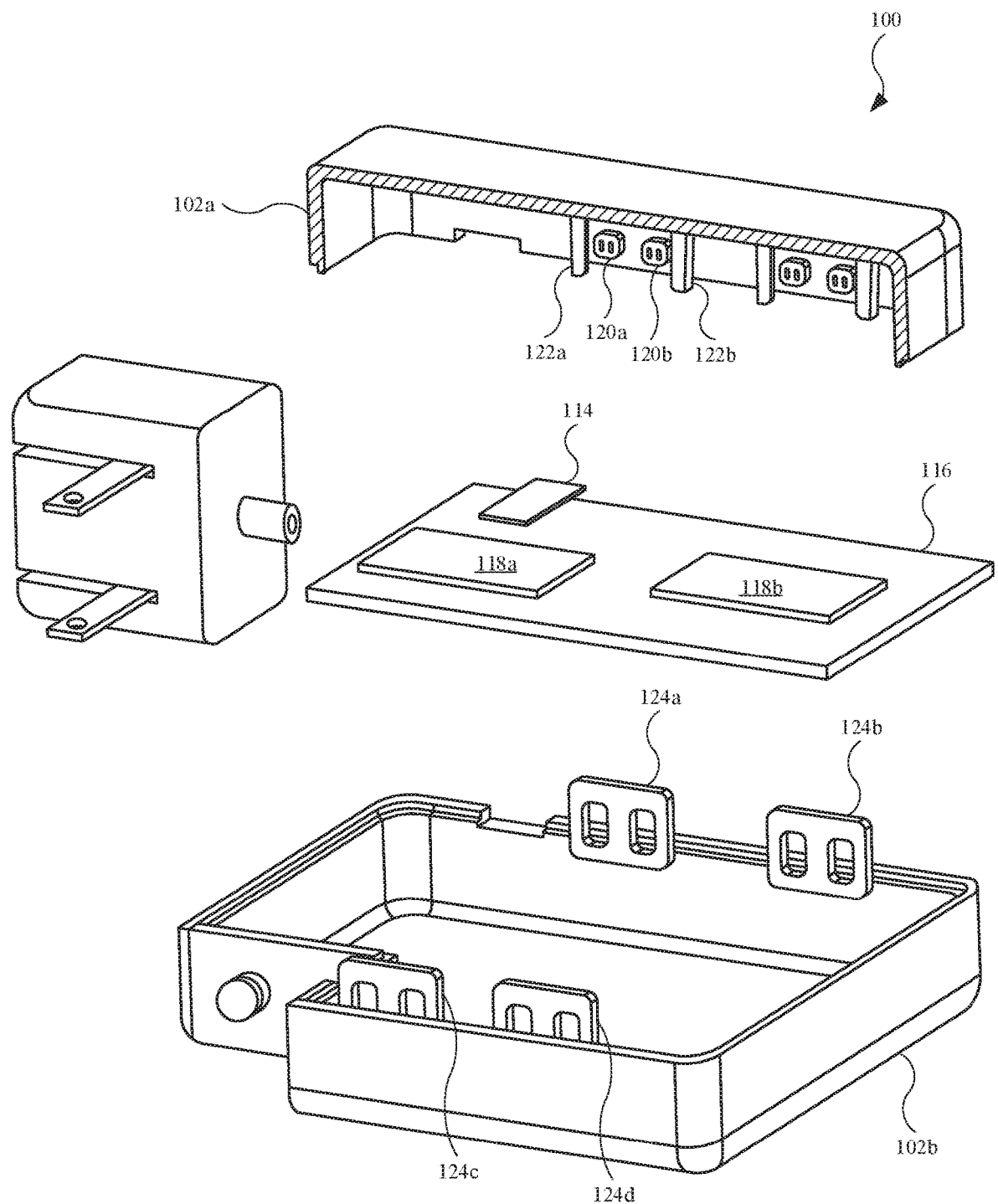
FIG. 3 illustrates an exploded view of the power adapter, showing several features used to connect the housing parts.

FIG. 3 illustrates an exploded view of power adapter 100, showing several features used to connect housing parts 102a and 102b. For purposes of simplicity, some features of power adapter 100 are removed. Also, a partial cross section of housing part 102a is shown, and additional features of housing part 102a may be present. Power adapter 100 may include circuit board 116 that holds, in addition to circuit board 114, several electronic components, such as an electronic component 118a and an electronic component 118b, each of which may be representative of additional electronic components. Electronic components 118a and 118b may include processing circuitry, capacitors, or an AC-to-DC converter, as non-limiting examples.

Housing parts 102a and 102b may include several features used to secure housing parts 102a and 102b together. For example, housing part 102a includes a protrusion 120a and a protrusion 120b, as well as a rail 122a and a rail 122b. Further, housing part 102b includes snap 124a. The aforementioned features of housing parts 102a and 102b may be integrally formed (e.g., injection molded) with their respective housing part. In an assembled state between housing parts 102a and 102b, protrusions 120a and 120b are each positioned in an opening (not labeled) of snap 124a, and rails 122a and 122b secure over edge regions of snap 124a. Accordingly, in the assembled state, the aforementioned features of housing parts 102a and 102b are integrally formed (with their respective housing part). Further, housing part 102b includes a snap 124b, a snap 124c, and a snap 124d. Although not specifically shown and labeled, housing part 102a may include a pair of protrusions and rails for each of snaps 124b, 124c, and 124d.

Figure 4:
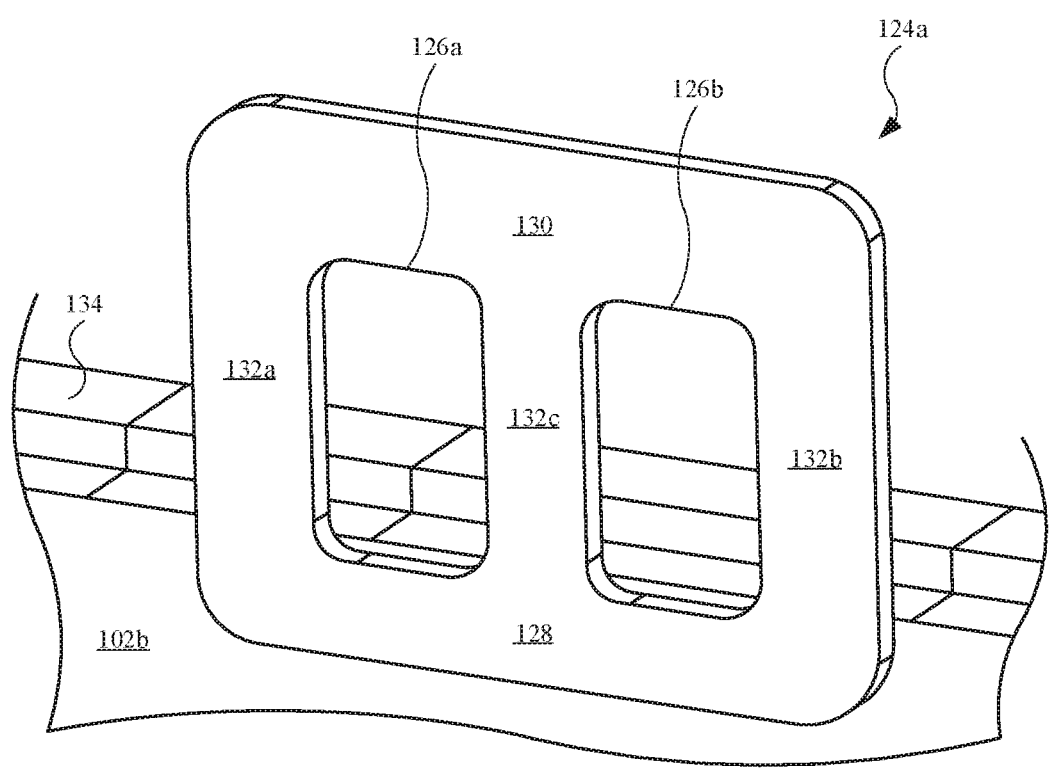
FIG. 4 illustrates an enlarged isometric view of the housing part, showing features of the snap.

FIG. 4 illustrates an enlarged isometric view of housing part 102b, showing features of snap 124a. As shown, snap 124a includes an opening 126a and an opening 126b, each of which representing a through hole designed to receive a protrusion, such as protrusions 120a and 120b (shown in FIG. 3). Additionally, snap 124a includes an attached region 128, representing a location in which snap 124a is secured with housing part 102b, and an unattached region 130, representing a location in which snap 124a is not secured to housing part 102b. Based on attached region 128 and unattached region, snap 124a may be referred to as a cantilevered snap designed to deflect, or bend, in response to a force to unattached region 130. In this manner, unattached region 130 is movable relative to attached region 128.

Additionally, snap 124a includes a column 132a, a column 132b, and a column 132c. As shown, snap 124a is generally flat and includes major surfaces that are planar. However, during an assembly between housing parts 102a and 102b (shown in FIG. 3), protrusions 120a and 120b (shown in FIG. 3) engage a surface of snap 124a along unattached region 130, causing snap 124a to deflect. While protrusions 120a and 120b engage the surface of snap 124a, rails 122a and 122b engage an opposing surface of snap 124a, and cover columns 132a and 132b, respectively. As a result, snap 124a deflects at certain locations of unattached region 130 and column 132c, but snap 124a remains generally flat along columns 132a and 132b. This will be shown and described below. It should be noted that snaps 124b, 124c, and 124d (shown in FIG. 3) may include any features and characteristics shown and described for snap 124a. Also, housing part 102b includes a ledge 134 designed to mate with a corresponding ledge of housing part 102a (shown in FIG. 3).

Figure 5:
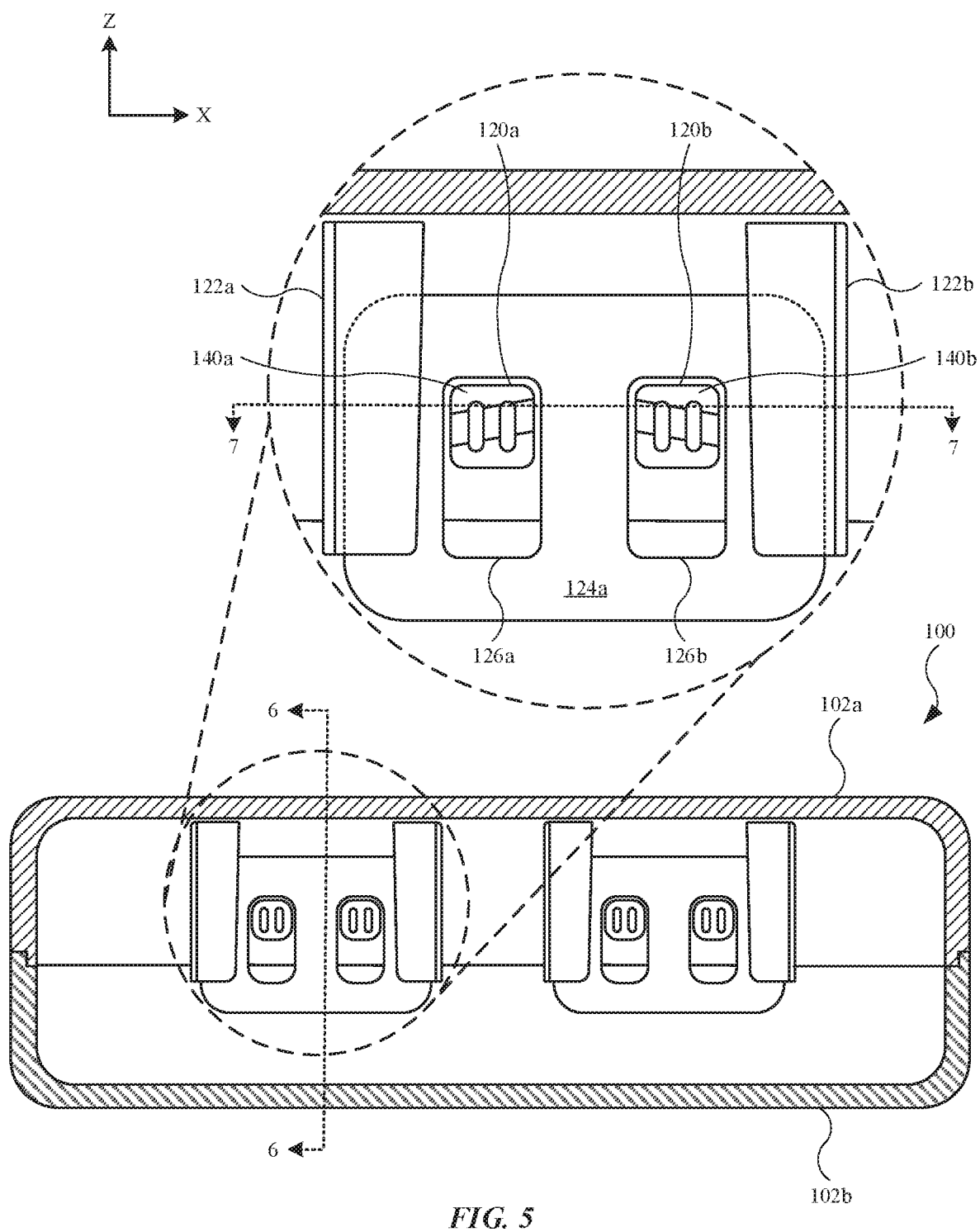
FIG. 5 illustrates a partial cross sectional view of the power adapter, showing the housings parts connected together by the snaps and the protrusions.

FIG. 5 illustrates a partial cross sectional view of power adapter 100, showing the housings parts 102a and 102b connected together by the snaps and the protrusions. As shown in the enlarged view, protrusions 120a and 120b, located on housing part 102a, are positioned in openings 126a and 126b, respectively, of snap 124a, which is secured with housing part 102b. Additionally, rails 122a and 122b cover end regions, or columns 132a and 132b (labeled in FIG. 4), respectively. Also, protrusions 120a and 120b may include an inclined surface 140a and an inclined surface 140b, respectively. Inclined surfaces 140a and 140b can define a tapered region, or ramp, designed to facilitate snap 124a passing over protrusions 120a and 120b during an assembly operation. In particular, the surface elevation of protrusions 120a and 120b may increase, based on inclined surfaces 140a and 140b, respectively, in a direction of travel by housing part 120a toward housing part 102b during assembly. This will be further shown and described below.

The assembled state between housing parts 102a and 102b may be defined in part by the relationship between protrusions 120a and 120b, rails 122a and 122b, and snap 124a shown in enlarged view. The relationship between snap 124a and protrusions 120a and 120b represent a mechanical interlock, while rails 122a and 122b engage snap 124a, thereby preventing or minimizing relative movement of snap 124a, and thus preventing or minimizing movement of housing part 102a relative to housing part 102b. In other words, the relationship between protrusions 120a and 120b, rails 122a and 122b, and snap 124a may prevent disassembly subsequent to an unassembled state. The features shown in enlarged view are representative of the remaining protrusions, rails, and snaps of housing parts 102a and 102b.

Figure 6:
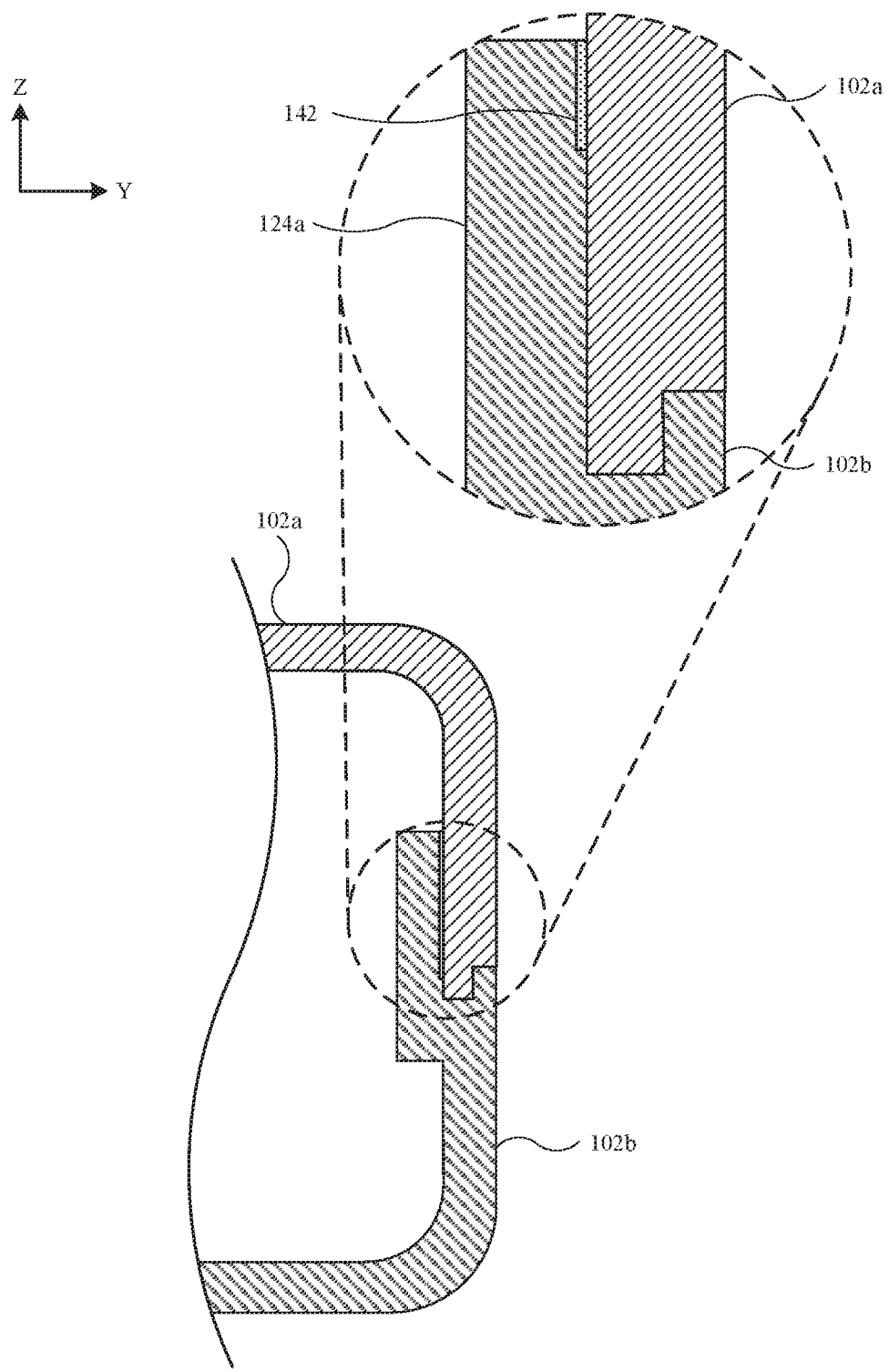
FIG. 6 illustrates a cross sectional view of the power adapter shown in FIG. 5, taken along line 6-6, showing the housing parts adhesively secured together.

FIG. 6 illustrates a cross sectional view of power adapter 100 shown in FIG. 5, taken along line 6-6, showing housing parts 102a and 102b adhesively secured together. As shown in the enlarged view, the assembled state may include housing parts 102a and 102b secured together by an adhesive 142. In particular, adhesive 142 may applied to housing part 102a or snap 124a such that the adhesive bond formed by adhesive 142 occurs between housing part 102a and snap 124a, the latter of which is integrally formed with housing part 102b. Further, adhesive 142 may be applied to an elevated location relative to protrusions 120a and 120b (shown in FIG. 5). For instance, the position of application of adhesive 142 to snap 124a (or housing part 102a) may be higher, along the Z-axis, than the position of protrusion 120a and 120b. In this manner, adhesive 142 may not come into contact with protrusions 120a and 120b.

Figure 7:
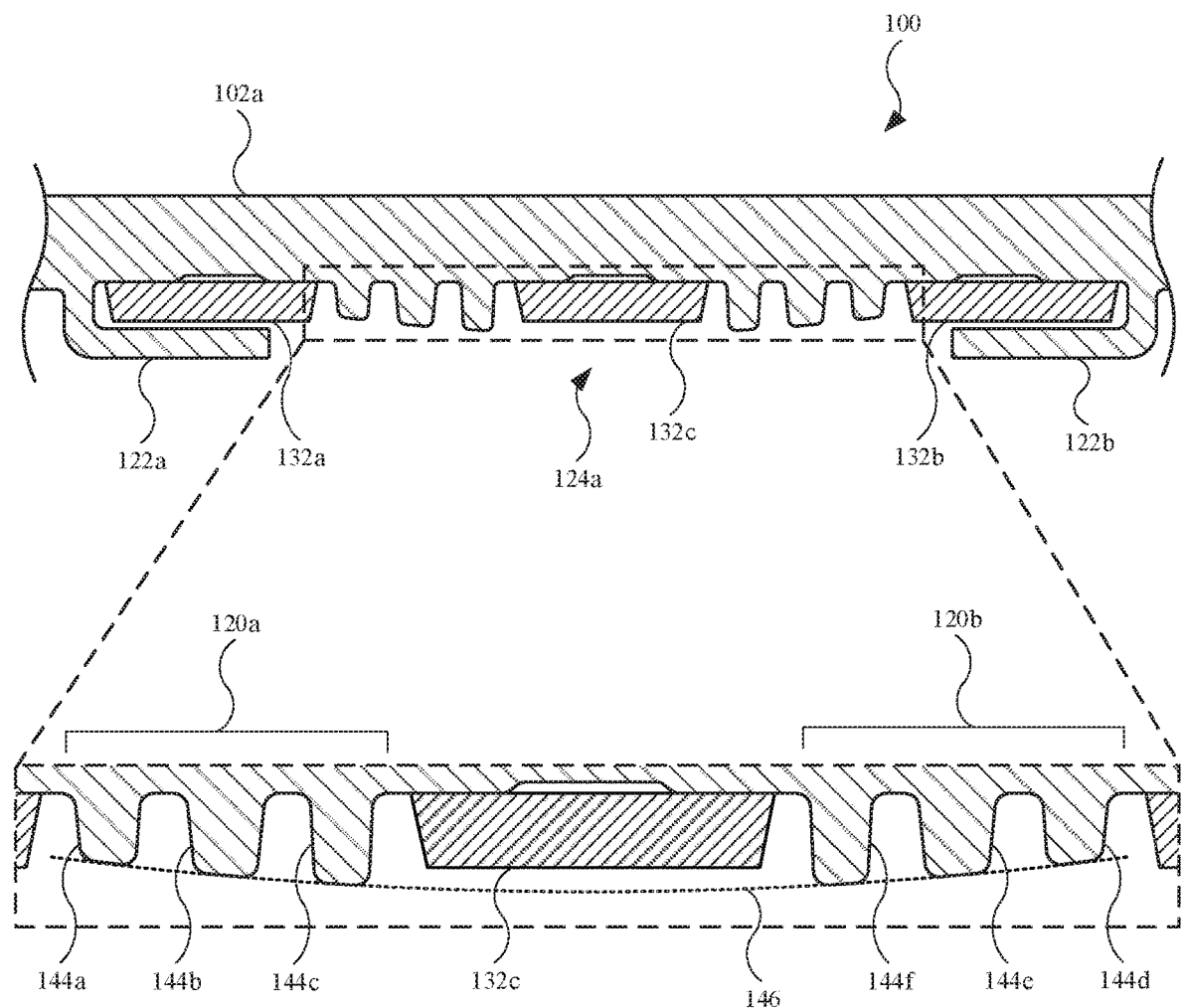
FIG. 7 illustrates a cross sectional view of the power adapter shown in FIG. 5, taken along line 7-7, showing additional features of the protrusions, the rails, and the snap, as well as their associated relationships.

FIG. 7 illustrates a cross sectional view of power adapter 100 shown in FIG. 5, taken along line 7-7, showing additional features of protrusions 120a and 120b, rails 122a and 122b, and snap 124a, as well as their associated relationships. As shown, rails 122a and 122b cover, or at least substantially cover, columns 132a and 132b, respectively, while column 132c is uncovered by any features on housing part 102a. Also, in some instances, rails 122a and 122b contact/engage columns 132a and 132b, respectively. In the embodiment shown in FIG. 7, rails 122a and 122b are separated from columns 132a and 132b, respectively, by small gaps, but may re-engage should snap 124a undergo a pulling force subsequent to assembly.

As shown in the enlarged view, protrusions 120a and 120b include several extensions that define inclined surfaces 140a and 140b, respectively (shown in FIG. 5). For example, protrusion 120a includes an extension 144a, an extension 144b, and an extension 144c. Extensions 144a, 144b, and 144c includes varying lengths, as extension 144c is longer than extension 144b, which is longer than extension 144a. Accordingly, extensions 144a, 144b, and 144c define inclined surface 140a (shown in FIG. 5). Similarly, protrusion 120b includes an extension 144d, an extension 144e, and an extension 144f. Extensions 144d, 144e, and 144f includes varying lengths, as extension 144f is longer than extension 144e, which is longer than extension 144d. Accordingly, extensions 144d, 144e, and 144f define inclined surface 140b (shown in FIG. 5). Moreover, extensions 144a, 144b, and 144c combine with extensions 144d, 144e, and 144f to define an arc 146. Arc 146 may include a curved line that is generally smooth, or continuous, in nature. Arc 146 may define a deflection, or bending, pattern in snap 124a during the assembly operation between the housing parts 102a and 102b (shown in FIG. 5) of power adapter 100.

Figure 8:
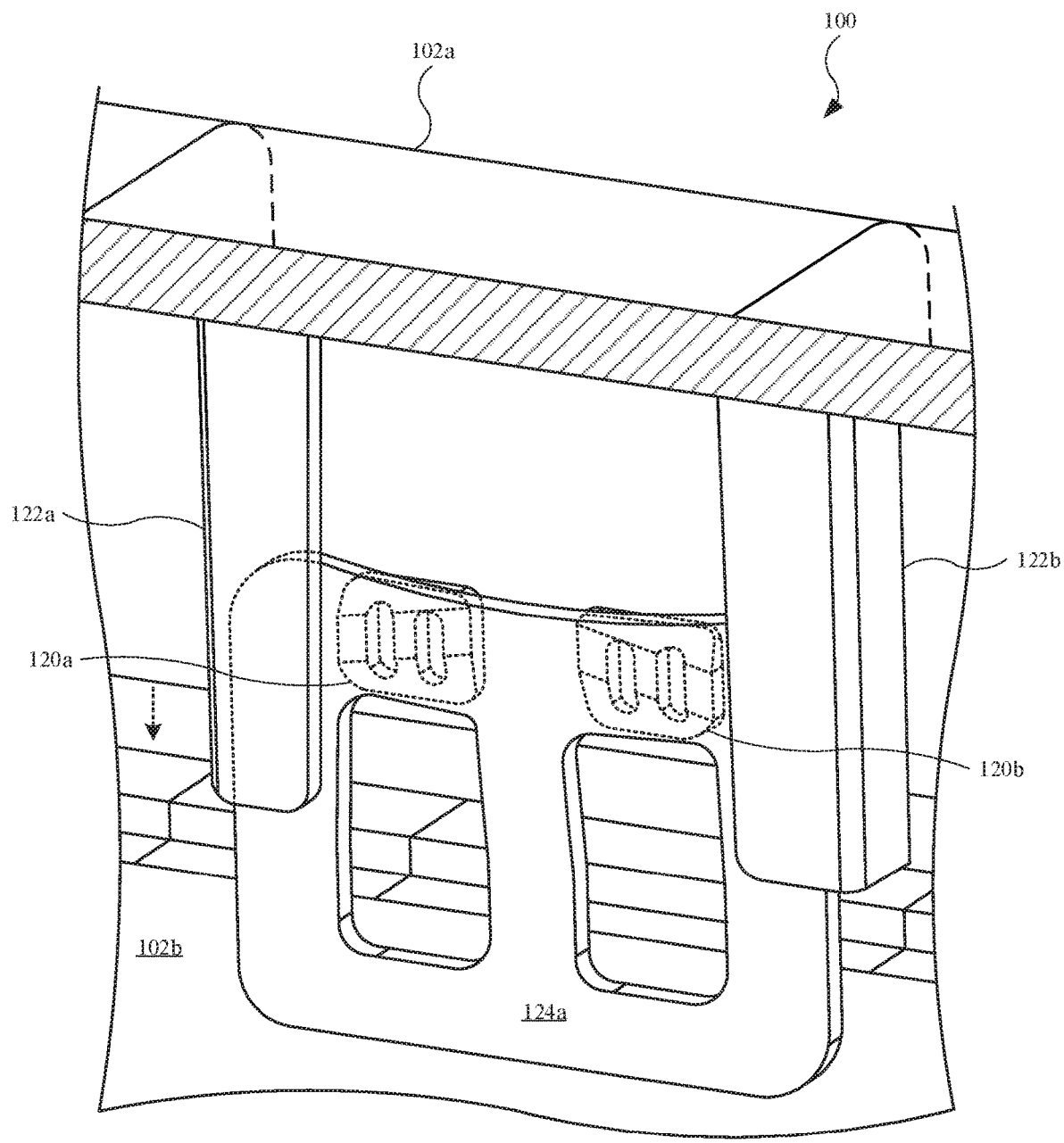
FIG. 8 illustrates an isometric view of the power adapter during an assembly operation.

FIG. 8 illustrates an isometric view of power adapter 100 during an assembly operation. As shown, housing part 102a moves toward housing part 102b, causing protrusions 120a and 120b to slide under snap 124a, and rails 122a and 122b to slide over snap 124a. Accordingly, protrusion 120a and 120b engage a surface of snap 124a, while rails 122a and 122b engage another (opposing) surface of snap 124a. As a result, during the assembly operation, snap 124a is deflected in multiple directions due to interaction with protrusions 120a and 120b, as well as rails 122a and 122b.

FIG. 9A-9C illustrate snap 124a shown in FIG. 8, showing snap 124a in a deflected state, in accordance with some described embodiments. FIG. 9A illustrates an isometric view of snap 124a isolated and in the deflected state. As shown, snap 124a is deflected along a deflection line 146a, a deflection line 146b, and a deflection line 146c. Based upon snap 124a having attached region 128, where snap 124a is attached to housing part 102b (not shown in FIG. 4), and unattached region 130, snap 124b can deflect along deflection line 146a, resulting in at least some deflection at unattached region 130 and column 132c in one direction. However, due in part to rails 122a and 122b (shown in FIG. 8) engaging columns 132a and 132b, respectively, during assembly, snap 124b can deflect along deflection lines 146b and 146c, resulting in additional deflection at unattached region 130 and column 132c in another, different direction. Further, due to rails 122a and 122b covering (or at least substantially covering) columns 132a and 132b, columns 132a and 132b remain generally planar/flat, i.e., un-deflected. The locations at which rails 122a and 122b cover columns 132a and 132b, respectively, generally define the location of deflection lines 146b and 146c, respectively.

FIG. 9B illustrates a cross sectional view of snap 124a shown in FIG. 9A, taken along line 9B-9B. Based upon the orientation shown, when snap 124a is not in the deflected state (represented by dotted lines), snap 124a generally extends along the Z-axis, with the cross-section lying on a Y-Z plane. However, as shown, snap 124a is deflected at deflection line 146a, causing snap 124a (and in particular, column 132c) to partially deflect along the Y-Z plane, thereby partially deflecting snap 124a out of the Z-axis.

FIG. 9C illustrates a cross sectional view of snap 124a shown in FIG. 9A, taken along line 9C-9C. Based upon the orientation shown, when snap 124a is not in the deflected state (represented by dotted lines), snap 124a generally extends along the X-axis, with the cross-section lying on an X-Y plane. However, as shown, snap 124a is deflected at deflection lines 146b and 146c, causing snap 124a (and in particular, unattached region 130) to partially deflect along the X-Y plane, thereby partially deflecting snap 124a out of the X-axis. In other words, snap 124a is curved, i.e., non-planar, between deflection lines 146b and 146c. However, snap 124a remains generally flat or planar along regions associated with columns 132a and 132b, defined generally by regions that lie outside deflection lines 146b and 146c. Accordingly, FIGS. 9A-9C show snap 124a bending in two different directions during an assembly operation. In other words, snap 124a is capable of bending in two different (perpendicular) directions during the assembly operation.

Figure 10:
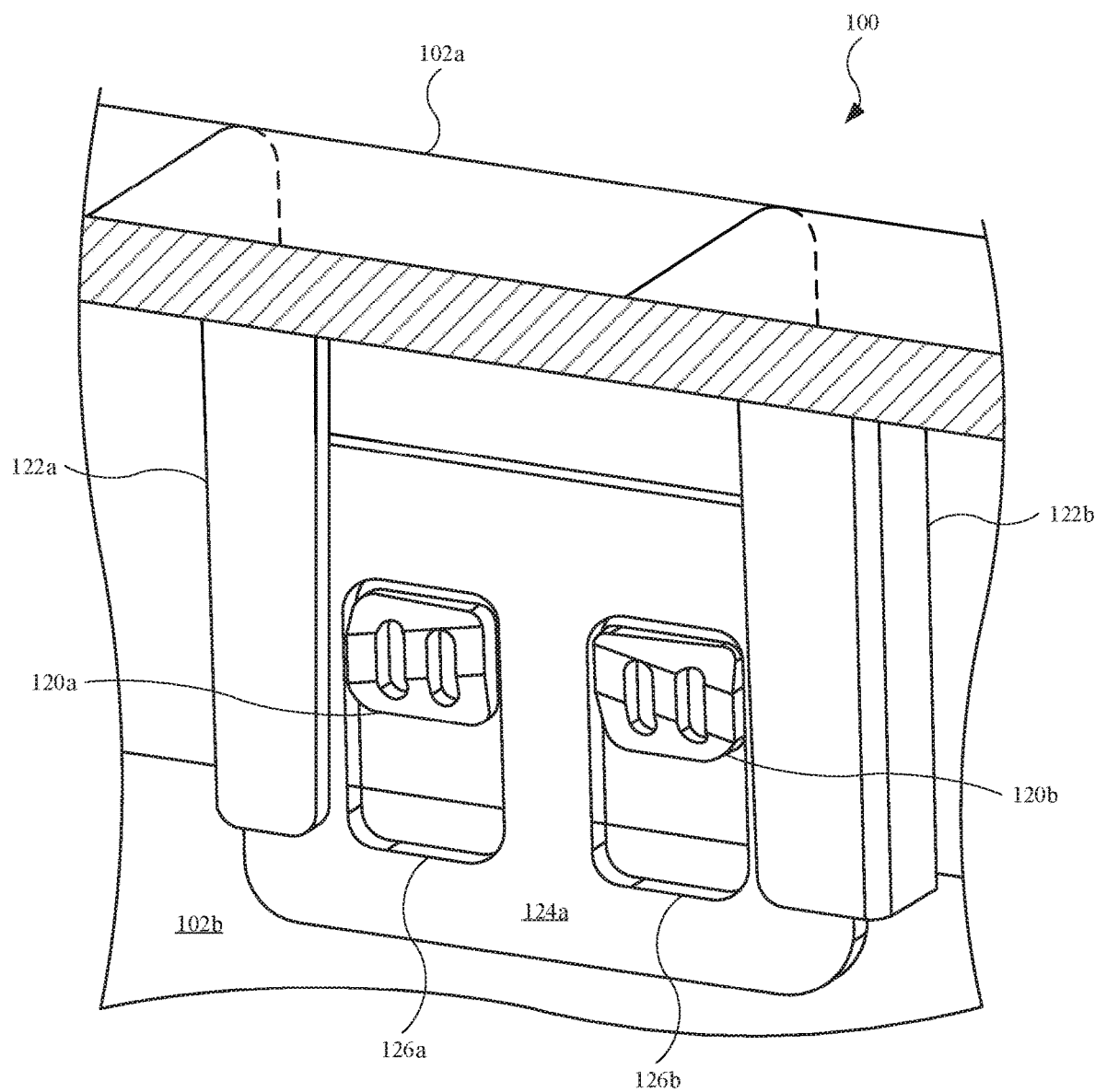
FIG. 10 illustrates a partial cross sectional view of the power adapter, showing the housing parts connected together in an assembled state.

FIG. 10 illustrates a partial cross sectional view of power adapter 100, showing housing parts 102a and 102b connected together in an assembled state. When housing parts 102a and 102b are secured together, protrusions 120a and 120*b* are positioned in openings 126*a* and 126*b*, respectively, of snap 124*a*. As a result, snap 124*a* is no longer in the deflected state, i.e., snap 124*a* returns to its (original) planar/flat state. Additionally, rails 122*a* and 122*b* at least partially cover end regions, defined by columns 132*a* and 132*b* (shown in FIG. 9A), respectively. As a result of protrusion 120*a* and 120*b* as well as rails 122*a* and 122*b*, snap 124*a* can resist at least some forces acting to pull housing parts 102*a* and 102*b* apart. Further, although now shown, housing parts 102*a* and 102*b* include additional protrusions, rails, and snaps that combine to resist forces that may otherwise pull housing parts 102*a* and 102*b* apart. Adhesive 142 (shown in FIG. 6) can also resist some forces acting to pull housing parts 102*a* and 102*b* apart.

FIGS. 5-10 show and describe mechanical features used to secure housing parts 102*a* and 102*b* together. Further, these features preclude the need for high-frequency and/or high-heat tools that may lead to damage to housing parts 102*a* and 102*b*, as well as circuit board 116 (shown in FIG. 3) and/or electrical components located on circuit board 116. Moreover, the mechanical features not only provide an advantageous method for assembly, but also provide a mechanism for preventing disassembly. As a result, traditional melting/welding methods may no longer be required.

Figure 11:
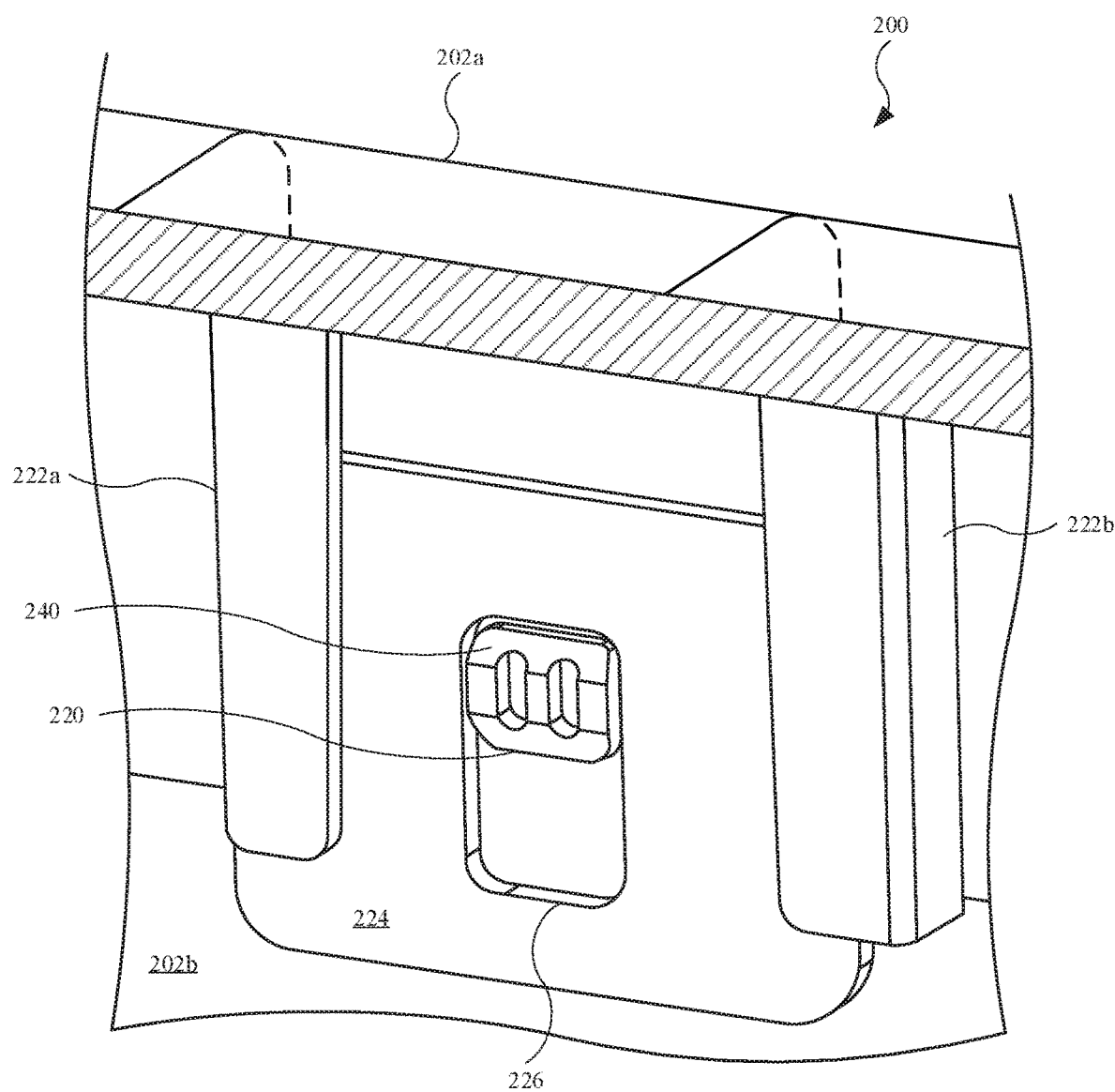
FIG. 11 illustrates a partial cross sectional view of an alternate embodiment of a power adapter, showing a different number of protrusions.
Figure 12:
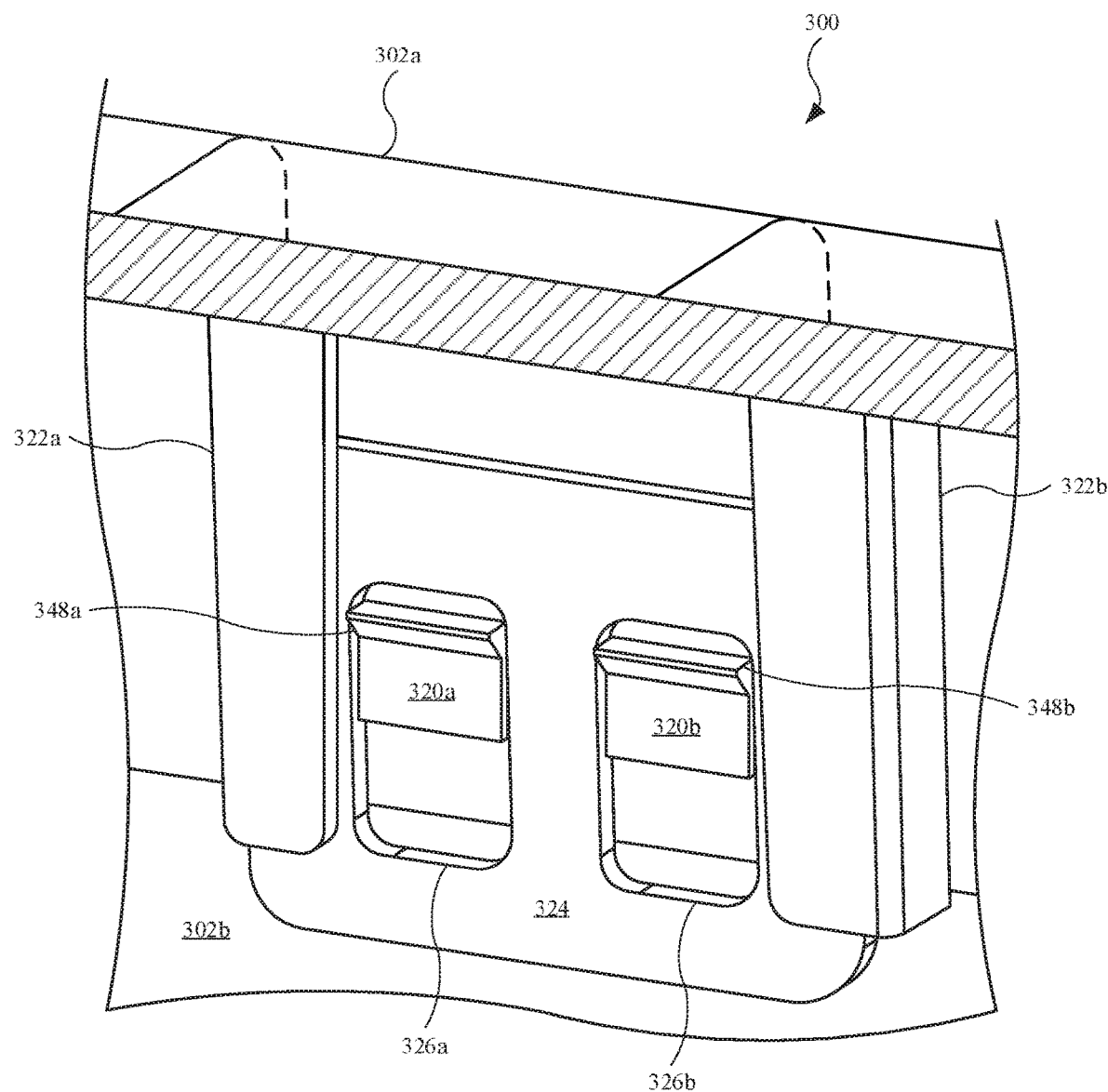
FIG. 12 illustrates a partial cross sectional view of an alternate embodiment of a power adapter, showing a different configuration of protrusions.
Figure 13:
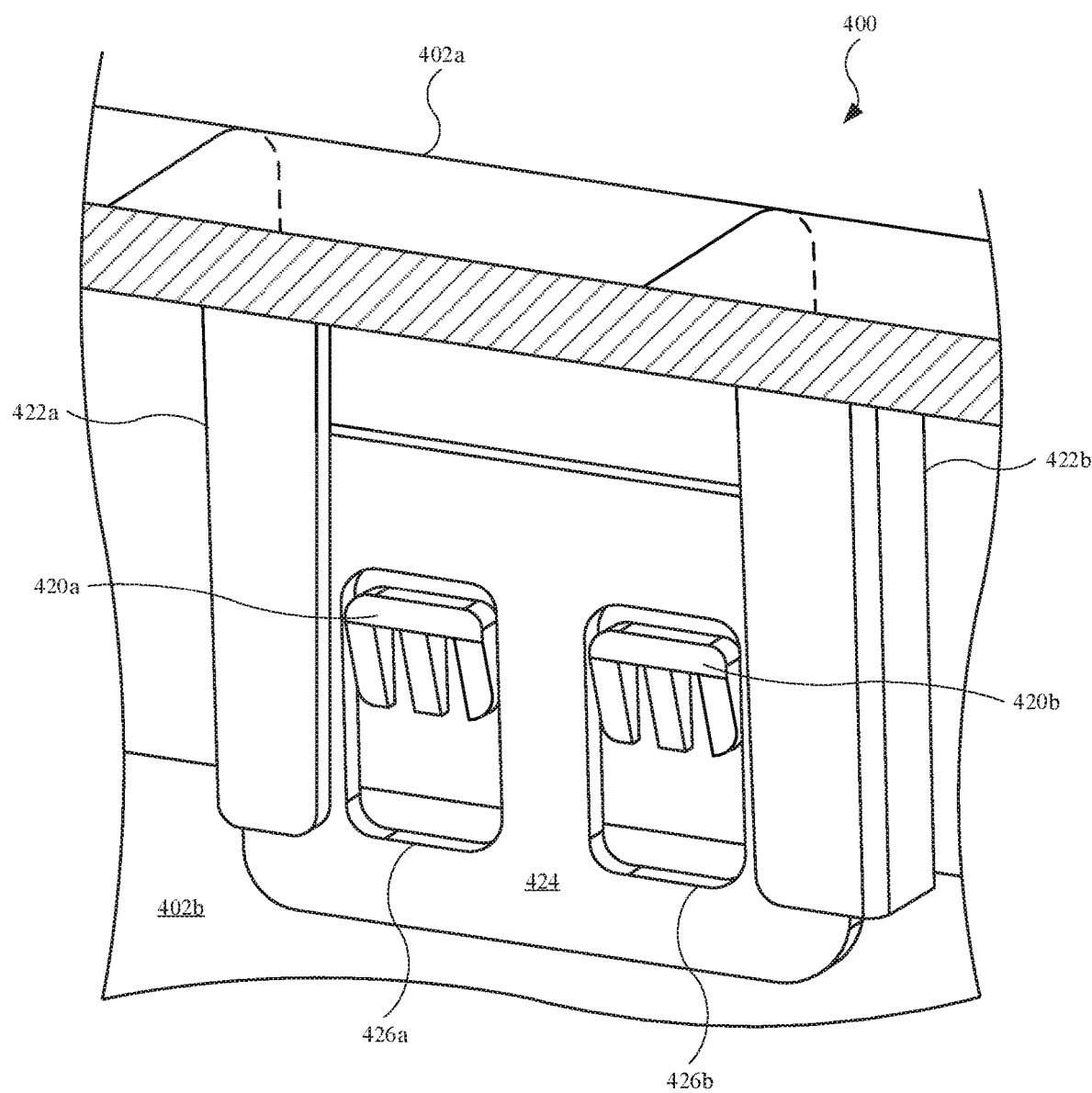
FIG. 13 illustrates a partial cross sectional view of an alternate embodiment of a power adapter, showing yet a different configuration of protrusions.

FIGS. 11-13 show and describe power adapters with different types of mechanical fasteners, in accordance with some described embodiments. The power adapters shown and described in FIGS. 11-13 may include several features and components previously described for a power adapter.

FIG. 11 illustrates a partial cross sectional view of an alternate embodiment of a power adapter 200, showing a different number of protrusions. As shown, power adapter 200 includes a housing part 202*a* and a housing part 202*b*. Housing part 202*a* includes a protrusion 220, a rail 222*a*, and a rail 222*b*, while housing part 202*b* includes a snap 224. Protrusion 220 represents a single protrusion used with snap 224. For instance, snap 224 includes an opening 226, representing a single opening in snap 224. Accordingly, in some instances, a latching assembly that includes a protrusion, rails, and a snap may require one protrusion, such as protrusion 220. Also, protrusion 220 may include an inclined surface 240 to facilitate snap 224 sliding over protrusion 220. Further, it should be noted that power adapter 200 may include several additional latch assemblies that includes features similar to protrusion 220, rails 222*a* and 222*b*, and snap 224.

FIG. 12 illustrates a partial cross sectional view of an alternate embodiment of a power adapter 300, showing a different configuration of protrusions. As shown, power adapter 300 includes a housing part 302*a* and a housing part 302*b*. Housing part 302*a* includes a protrusion 320*a* and a protrusion 320*b*, as well as a rail 322*a* and a rail 322*b*, while housing part 302*b* includes a snap 324 that defines an opening 326*a* and an opening 326*b*. Similar to prior embodiments, protrusions 320*a* and 320*b* are positioned in openings 326*a* and 326*b*, in accordance with an assembled state.

Whereas prior embodiments of protrusions included inclined surfaces, protrusions 320*a* and 320*b* include a tab 348*a* and a tab 348*b*, respectively. Tabs 348*a* and 348*b* generally represent a triangular cross section with a generally perpendicular surface and an inclined surface. However, the slope of the inclined surfaces of tabs 348*a* and 348*b* may facilitate pulling snap 324 away from protrusions 320*a* and 320*b* to pull housing parts 302*a* and 302*b* apart. Accordingly, in some embodiments, power adapter 300 may include features designed for rework applications, in order to inspect and/or provide repairs.

FIG. 13 illustrates a partial cross sectional view of an alternate embodiment of a power adapter 400, showing yet a different configuration of protrusions. As shown, power adapter 400 includes a housing part 402*a* and a housing part 402*b*. Housing part 402*a* includes a protrusion 420*a* and a protrusion 420*b*, as well as a rail 422*a* and a rail 422*b*, while housing part 402*b* includes a snap 424 that defines an opening 426*a* and an opening 426*b*. Similar to prior embodiments, protrusions 420*a* and 420*b* are positioned in openings 426*a* and 426*b*, in accordance with an assembled state.

Whereas prior embodiments of protrusion included inclined surface, protrusions 320*a* and 320*b* include inclined surfaces (not labeled), with the slope of the inclined surfaces positioned to facilitate pulling snap 424 away from protrusions 420*a* and 420*b* to pull housing parts 402*a* and 402*b* apart. In particular, the inclined surfaces of protrusions 420*a* and 420*b* are relatively long and gradual, which may facilitate sliding snap 424 over protrusions 420*a* and 420*b*. Accordingly, in some embodiments, power adapter 400 may include yet another embodiment in which protrusions 420*a* and 420*b* are modified for rework applications.

Figure 14:
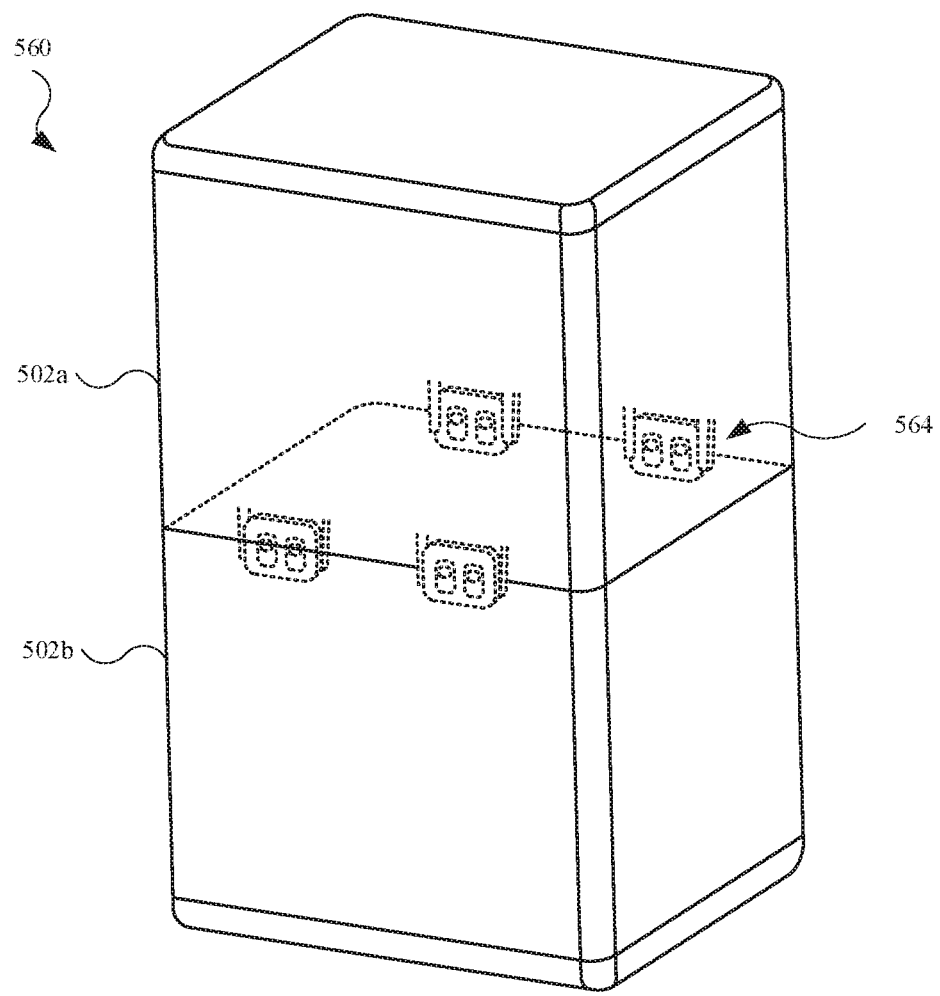
FIG. 14 illustrates an alternate embodiment of electronic devices using snaps and protrusions to secure housing parts together.

FIG. 14 illustrates an alternate embodiment of electronic devices using snaps and protrusions to secure housing parts together. FIG. 14 illustrates an isometric view of a network device 560. Network device 560 may include a network router or modem, as non-limiting examples, used to transmit data via Internet technology. As shown, network device 560 includes a housing part 502*a* and a housing part 502*b* connected with housing part 502*a*. Network device 560 further includes a latch assembly 564, representative of additional latch assemblies (not labeled). Latch assembly 564 may include mechanical features previously described for securing housing parts together. For instance, latch assembly 564 may include one or more protrusions and one or more rails secured with housing part 502*a*. Latch assembly 564 further includes a snap secured with housing part 502*b*. As a result, latch assembly 564 includes features used to secure housing parts 502*a* and 502*b* together.

While this detailed description shows and describes power adapters and other devices (e.g., network device 560) that advantageously employ modified latch features (e.g., protrusions, rails, and snaps), it should be noted that other devices may include the latch features shown and described herein. For example, video streaming devices, mobile wireless communication devices (e.g., smartphones, tablet computing devices), laptop computing devices may also incorporate the latch features described herein. Generally, products in which a housing is defined by at least two distinct housing components may incorporate the latch features described herein to secure together the housing components.

Figure 15:
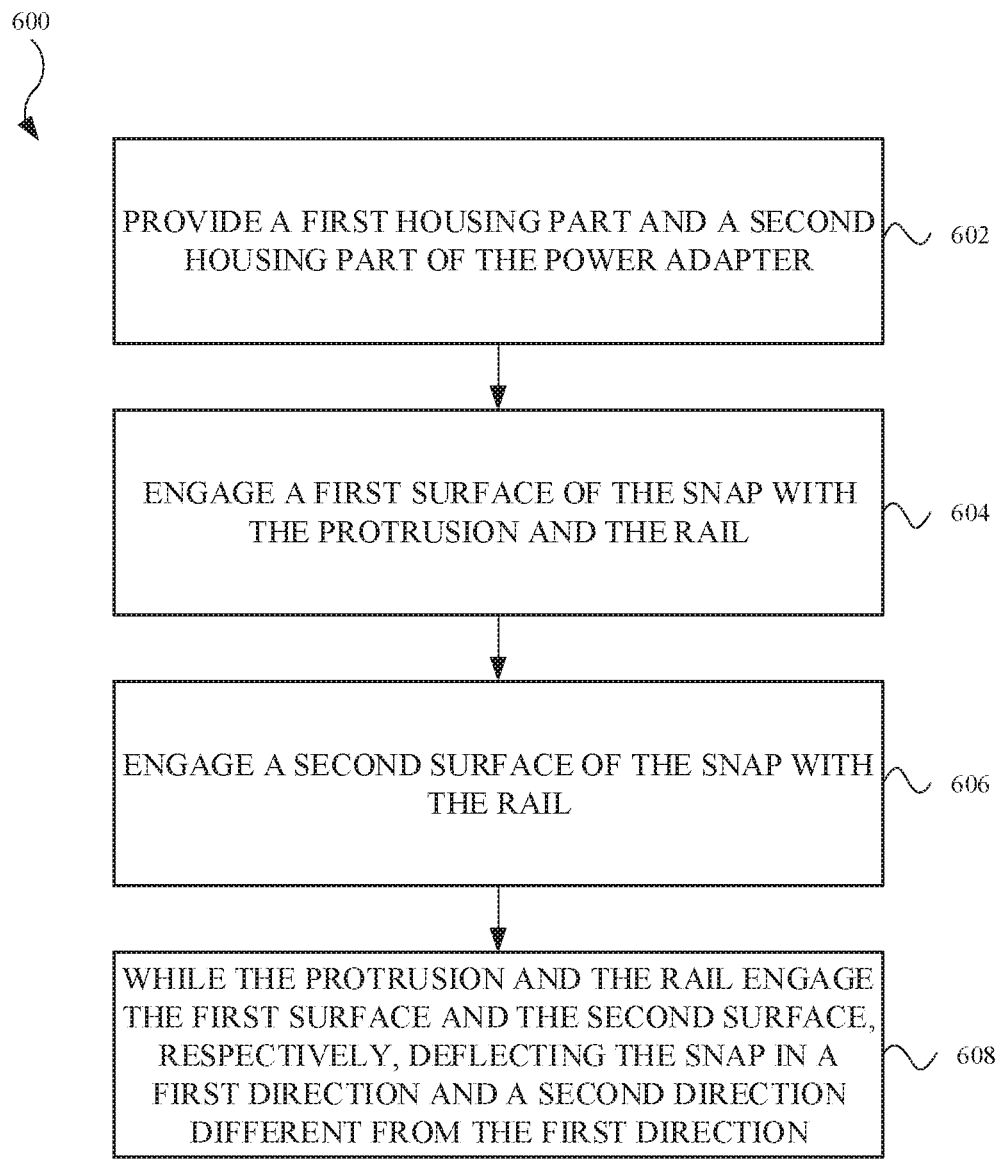
FIG. 15 illustrates a method for assembling a power adapter, in accordance with some described embodiments.

FIG. 15 illustrates a method 600 for assembling a device, in accordance with some described embodiments. The device may include power adapters or any device described herein. In this regard, the power adapters and devices described herein may incorporate method 600 during an assembly operation.

In step 602, a first housing part and a second housing part of the power adapter are provided. The first housing part may include a protrusion and a rail. Additionally, the first housing part may include a second protrusion and a second rail, and the protrusion and the second protrusion may be positioned between the first rail and the second rail. Also, the second housing part may a snap.

In step 604, a first surface of the snap engages the protrusion and the rail. In order for the snap to engage the protrusion, the first housing part is moved toward (and relative to) the second housing part, or vice versa.

In step 606, a first surface of the snap engages the rail. The first and second surface may define major surfaces. Further, first and second surface are opposing surfaces.

In step 608, while the protrusion and the rail engage the first surface and the second surface, respectively, the snap is deflected in a first direction and a second direction different from the first direction. The deflection of the snap is defined by a curved, non-planar, surface (or surfaces) of the snap. However, the snap, in locations where the rail(s) cover the snap, can remain planar/flat despite engagement with the protrusion that causes a deflection in the snap in other locations of the snap.

Figure 16:
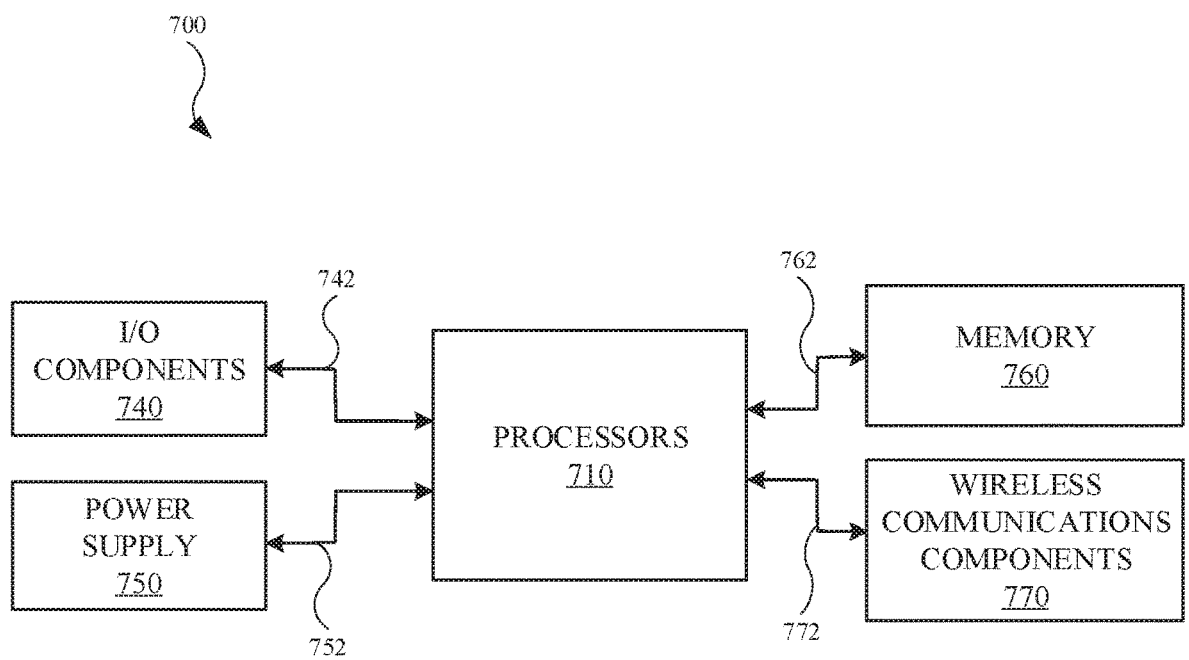
FIG. 16 illustrates a block diagram of an electronic device, in accordance with some described embodiments.

FIG. 16 illustrates a block diagram of an electronic device 700, in accordance with some described embodiments. The features in electronic device 700 may be present in other electronic devices described herein. Electronic device 700 may include one or more processors 710 for executing functions of the electronic device 700. One or more processors 710 can refer to at least one of a central processing unit (CPU) and at least one microcontroller for performing dedicated functions. Also, one or more processors 710 can refer to application specific integrated circuits.

According to some embodiments, electronic device 700 can include one or more input/output components 740. In some cases, the one or more input/output components 740 can refer to a button or a switch that is capable of actuation by the user. When one or more input/output components 740 are used, one or more input/output components 740 can generate an electrical signal that is provided to one or more processors 710 via one or more connection cables 742.

According to some embodiments, electronic device 700 can include a power supply 750 that is capable of providing energy to the operational components of electronic device 700. In some examples, power supply 750 can refer to a rechargeable battery. Power supply 750 can be connected to one or more processors 710 via one or more connection cables 752. The power supply 750 can be directly connected to other devices of electronic device 700, such as one or more input/output components 740. In some examples, electronic device 700 can receive power from another power sources (e.g., an external charging device).

According to some embodiments, electronic device 700 can include memory 760, which can include a single disk or multiple disks (e.g., hard drives), and includes a storage management module that manages one or more partitions within memory 760. In some cases, memory 760 can include flash memory, semiconductor (solid state) memory or the like. Memory 760 can also include a Random Access Memory ("RAM") and a Read-Only Memory ("ROM"). The ROM can store programs, utilities or processes to be executed in a non-volatile manner. The RAM can provide volatile data storage, and stores instructions related to the operation of the electronic device 700. In some embodiments, memory 760 refers to a non-transitory computer readable medium. One or more processors 710 can also be used to execute software applications. In some embodiments, a data bus 762 can facilitate data transfer between memory 760 and one or more processors 710.

According to some embodiments, electronic device 700 can include wireless communications components 770. A network/bus interface 772 can couple wireless communications components 770 to one or more processors 710. Wireless communications components 770 can communicate with other electronic devices via any number of wireless communication protocols, including at least one of a global network (e.g., the Internet), a wide area network, a local area network, a wireless personal area network (WPAN), or the like. In some examples, the wireless communications components 770 can communicate using NFC protocol, BLUETOOTH® protocol, or WIFI® protocol.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. A power adapter for providing electrical energy to electronic devices, the power adapter comprising:
   a first housing part comprising:
      a protrusion, and
      a rail; and
   a second housing part comprising a snap, the snap comprising:
      an opening, and
      a column,
   wherein an assembled state defined by the first housing part secured with the second housing part comprises the protrusion positioned in the opening and the rail covering the column.

2. The power adapter of claim 1, further comprising a second protrusion, wherein:
   the protrusion defines a first protrusion that includes a first inclined surface,
   the second protrusion that includes a second inclined surface, and
   the first inclined surface and the second inclined surface define an arc.

3. The power adapter of claim 1, wherein the first housing part further comprises a second rail, wherein the rail defines a first rail,
the column defines a first column, and
the second rail covers a second column of the snap in the assembled state, the second column opposite the first column.

4. The power adapter of claim 3, wherein during a transition to the assembled state, the protrusion causes the snap to deflect except for the first column and the second column.

5. The power adapter of claim 1, wherein the snap comprises:
a first column defined by the column,
a second column, and
a third column positioned between the first column and the second column, wherein only the third column deflects during a transition to the assembled state.

6. The power adapter of claim 1, further comprising:
a port configured to couple with a cable, and
a plug configured to electrically couple with a power source.

7. The power adapter of claim 1, the snap comprises a cantilevered snap.

8. A power adapter for providing electrical energy to electronic devices, the power adapter comprising:
a first housing part comprising:
a first rail
a second rail,
a first protrusion that defines a first inclined surface, and
a second protrusion that defines a second inclined surface; and
a second housing part comprising a snap, the snap comprising:
a first opening configured to receive the first protrusion,
a second opening configured to receive the second protrusion,
a first column, and
a second column,
wherein during an assembly of the first housing part with the second housing part, the first protrusion and the second protrusion deflect the snap in accordance with the first inclined surface and the second inclined surface, and the first rail and the second rail secure the first column and the second column, respectively, such that the snap lacks deflection at the first column and the second column.

9. The power adapter of claim 8, wherein the first protrusion and the second protrusion deflect the snap to define a deflected region of the snap, and the deflected region follows an arc defined by the first inclined surface and the second inclined surface.

10. The power adapter of claim 9, wherein the snap, in the deflected region, is bent along a first dimension and a second dimension different from the first dimension.

11. The power adapter of claim 10, wherein the first dimension is perpendicular to the second dimension.

12. The power adapter of claim 8, wherein the snap further comprises a third column separated from i) the first column by the first opening, and ii) the second column by the second opening.

13. The power adapter of claim 8, wherein during the assembly, the first protrusion and the second protrusion engage a first surface of the snap, and the first rail and the second rail engage a second surface of the snap, the second surface opposite the first surface.

14. The power adapter of claim 13, wherein the snap comprises:
an attached region that extends from the second housing part; and
an unattached region movable with respect to the attached region.

15. An electronic device, comprising:
a first housing part comprising:
a first rail
a second rail,
a first protrusion, and
a second protrusion, wherein the first protrusion and the second protrusion are positioned between the first rail and the second rail; and
a second housing part comprising a snap, wherein during an assembly of the first housing part with the second housing part, the snap is configured to bend in a first direction and a second direction different from the first direction based upon engagement with the first rail, the second rail, the first protrusion, and the second protrusion.

16. The electronic device of claim 15, wherein the snap comprises:
an attached region secured with the second housing part; and
an unattached region opposite the attached region, the unattached region configured to bend in the first direction and the second direction.

17. The electronic device of claim 15, wherein the first direction is perpendicular with respect to the second direction.

18. The electronic device of claim 15, wherein the snap comprises:
a first rail;
a second rail; and
a third rail positioned between the first rail and the second rail.

19. The electronic device of claim 18, wherein during the assembly, the snap is deflected at the third rail, and the snap lacks a deflection at the first rail and the second rail.

20. The electronic device of claim 15, wherein the snap comprises a first opening and a second opening, and in an assembled state, the first protrusion is located in the first opening and the second protrusion is located in the second opening.

* * * * *

UNITED STATES PATENT AND TRADEMARK OFFICE
CERTIFICATE OF CORRECTION

PATENT NO. : 11,516,929 B2  
APPLICATION NO. : 16/996795  
DATED : November 29, 2022  
INVENTOR(S) : Peter A. Dvorak et al.

Page 1 of 1

It is certified that error appears in the above-identified patent and that said Letters Patent is hereby corrected as shown below:

In the Claims

Column 14, Line 43 (Claim 18): Add --snap-- after "first";

Column 14, Line 44 (Claim 18): Add --snap-- after "second";

Column 14, Line 45 (Claim 18): Add --snap-- after "third";

Column 14, Line 48 (Claim 19): Add --snap-- after "third";

Column 14, Line 49 (Claim 19): Add --snap-- after "first";

Column 14, Line 49 (Claim 19): Add --snap-- after "second".

Signed and Sealed this  
Twenty-fourth Day of January, 2023

Katherine Kelly Vidal  
*Director of the United States Patent and Trademark Office*